(12) United States Patent
Shimizu et al.

(10) Patent No.: US 7,595,711 B2
(45) Date of Patent: Sep. 29, 2009

(54) SWITCH FOR VEHICLES

(75) Inventors: Masaru Shimizu, Kyoto (JP); Kiyotaka Sasanouchi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/176,523

(22) Filed: Jul. 21, 2008

(65) Prior Publication Data

US 2009/0051408 A1    Feb. 26, 2009

(30) Foreign Application Priority Data

Aug. 24, 2007    (JP)    ............... 2007-217943

(51) Int. Cl.
*H01H 9/00*    (2006.01)
*H01H 3/14*    (2006.01)
(52) U.S. Cl. ............... 335/205; 338/32 R; 338/32 H; 324/207.11; 324/207.26; 200/61.89

(58) Field of Classification Search ......... 335/205–207; 338/32 R, 32 H; 324/207.11, 207.26; 200/61.89–61.9
See application file for complete search history.

(56) References Cited

FOREIGN PATENT DOCUMENTS

| JP | 2006033411 A | * | 2/2006 |
|---|---|---|---|
| JP | 2006-92777 A | | 4/2006 |

* cited by examiner

*Primary Examiner*—Ramon M Barrera
(74) *Attorney, Agent, or Firm*—RatnerPrestia

(57) ABSTRACT

Provided is a switch for vehicles, which includes an intermittent driving device connected to a control device which opens and closes a switching device based on the magnitude of the magnetism of a magnet mounted on an operating body. Therefore, the supply of power from a battery to a detection device and the control device is intermittently performed at a predetermined period by the intermittent driving device.

2 Claims, 6 Drawing Sheets

SWITCH FOR VEHICLES

BACKGROUND OF THE INVENTION

1. Field of the Invention

The present invention relates to a switch for vehicles, which is used for controlling the turn-on/off of a stop lamp when operating a brake pedal of a vehicle.

2. Description of the Related Art

Recently, a pressing-operation-type switch for vehicles is frequently used for controlling a stop lamp in accordance with the operation of a brake pedal. Specifically, the switch for vehicles turns on the stop lamp when the brake pedal is stepped on, and turns off the stop lamp when the brake pedal is not stepped on.

Such a conventional switch for vehicles will be described with reference to FIGS. 5 and 6.

FIG. 5 is a cross-sectional view of a conventional switch for vehicles. In FIG. 5, case 1 is formed in a box shape of which the top surface is opened and is formed of insulating resin. Operating body 2 is housed in case 1 so as to vertically move. Further, operating body 2 has magnet 3 mounted on a lower left side surface thereof.

A plurality of terminals 4 are formed of conductive metal. Wiring substrate 5 has a plurality of wiring patterns (not shown) formed on the right and left surfaces thereof. Wiring substrate 5 is disposed at the left side wall of case 1, and the upper ends of terminals 4 are connected to the wiring patterns of wiring substrate 5 by soldering or the like. Further, the lower ends of terminals 4 project downward from the bottom surface of case 1.

Wiring substrate 5 has detection device 6 such as a hall element and switching device 7 such as a power transistor formed on one surface thereof facing magnet 3. Further, control device 8 composed of a FET and a plurality of fixed resistors is formed on the surface of wiring substrate 5. Detection device 6 and switching device 7 are connected to control device 8.

Cover 10 formed of insulating resin covers the opening portion of the top surface of case 1. Further, coil-shaped return spring 9 is mounted in such a state where it is bent between the lower surface of operating body 2 and the bottom surface of case 1. Return spring 9 biases operating body 2 upward, and the upper end of operating shaft 2A of operating body 2 projects upward from hollow cylindrical portion 10A formed in the center of the top surface of cover 10.

FIG. 6 is a side view of essential parts of a brake pedal using the conventional switch for vehicles. In FIG. 6, conventional switch 12 for vehicles constructed in the above-described manner is mounted in front of brake pedal 13 of a vehicle in a state where operating shaft 2A of operating body 2 is pressed by arm 13A. Further, the plurality of terminals 4 projecting from the bottom surface of case 1 are connected to a stop lamp, an ignition switch, a battery and so on through connector 14 and lead wires.

In a state where brake pedal 13 is not stepped on, operating shaft 2A of operating body 2 is pressed downward while bending return spring 9, and magnet 3 mounted on the left side surface of operating body 2 is moved downward. Then, the center of detection device 6 disposed to face the center of magnet 3 is significantly separated from each other, and the magnetism of magnet 3 which is detected by detection device 6 decreases.

Control device 8 connected to detection device 6 controls switching device 7 based on the magnitude of the magnetism (magnetic flux density) detected by detection device 6. That is, when the magnetic flux density is equal to or more than a predetermined value, control device 8 switches switching device 7 into a close state. When the magnetic flux density is less than the predetermined value, control device 8 switches switching device 7 into an open state. Accordingly, in a state where operating body 2 is pressed, switching device 7 is set in the open state, and the stop lamp is turned off.

When brake pedal 13 is stepped on, arm 13A is separated from operating shaft 2A such that the pressing force is canceled. Therefore, as shown in FIG. 5, operating body 2 is moved upward by the elastic restoring force of return spring 9. Then, magnet 3 mounted on the left side surface of operating body 2 is also moved upward in such a manner that magnet 3 and detection device 6 face each other. Accordingly, the magnetism of magnet 3 which is detected by detection device 6 increases. Then, control device 8 switches switching device 7 into the close state, and the stop lamp is turned on.

In the above-described operation of brake pedal 13, when a vehicle is stopped in a place where a following vehicle is present, and if brake pedal 13 is stepped on, the stop lamp needs to be turned on, even in a state where the ignition switch is turned off so as to stop the engine.

Therefore, in the conventional switch for vehicles, even when the ignition switch is turned off so as to stop the engine, power is always supplied from the battery to detection device 6 which detects the magnetism of magnet 3 and control device 8 which switches switching device 7 so as to turn on/off the stop lamp. Accordingly, the stop lamp can be turned on.

As the related art document related to the invention of the present application, Japanese Patent Unexamined Publication No. 2006-92777 is known.

In the conventional switch for vehicles, however, even when the ignition switch is turned off so as to stop the engine, power is always supplied from the battery to detection device 6 and control device 8 such that the stop lamp can be turned on when brake pedal 13 is stepped on. Specifically, a current of about 3 mA always flows. Therefore, the consumption of the battery occurs during this term.

SUMMARY OF THE INVENTION

Accordingly, it is an object of the present invention to provide a switch for vehicle which can achieve low power consumption and can reliably turn on/off a stop lamp.

The switch for vehicle according to the invention includes an intermittent driving device connected to a control device which opens and closes a switching device based on the magnitude of the magnetism of a magnet mounted on an operating body. The supply of power from a battery to the control device is intermittently performed at a predetermined period by the intermittent driving device such that the power consumption of the battery can be minimized. Therefore, it is possible to obtain the switch for vehicles, which can achieve low power consumption and can reliably turn on/off a stop lamp.

BRIEF DESCRIPTION OF THE DRAWINGS

FIG. 4B is a diagram showing a term during which the brake pedal using the switch for vehicles according to the first embodiment of the invention is stepped on;

DETAILED DESCRIPTION OF PREFERRED EMBODIMENTS

Figure 1:
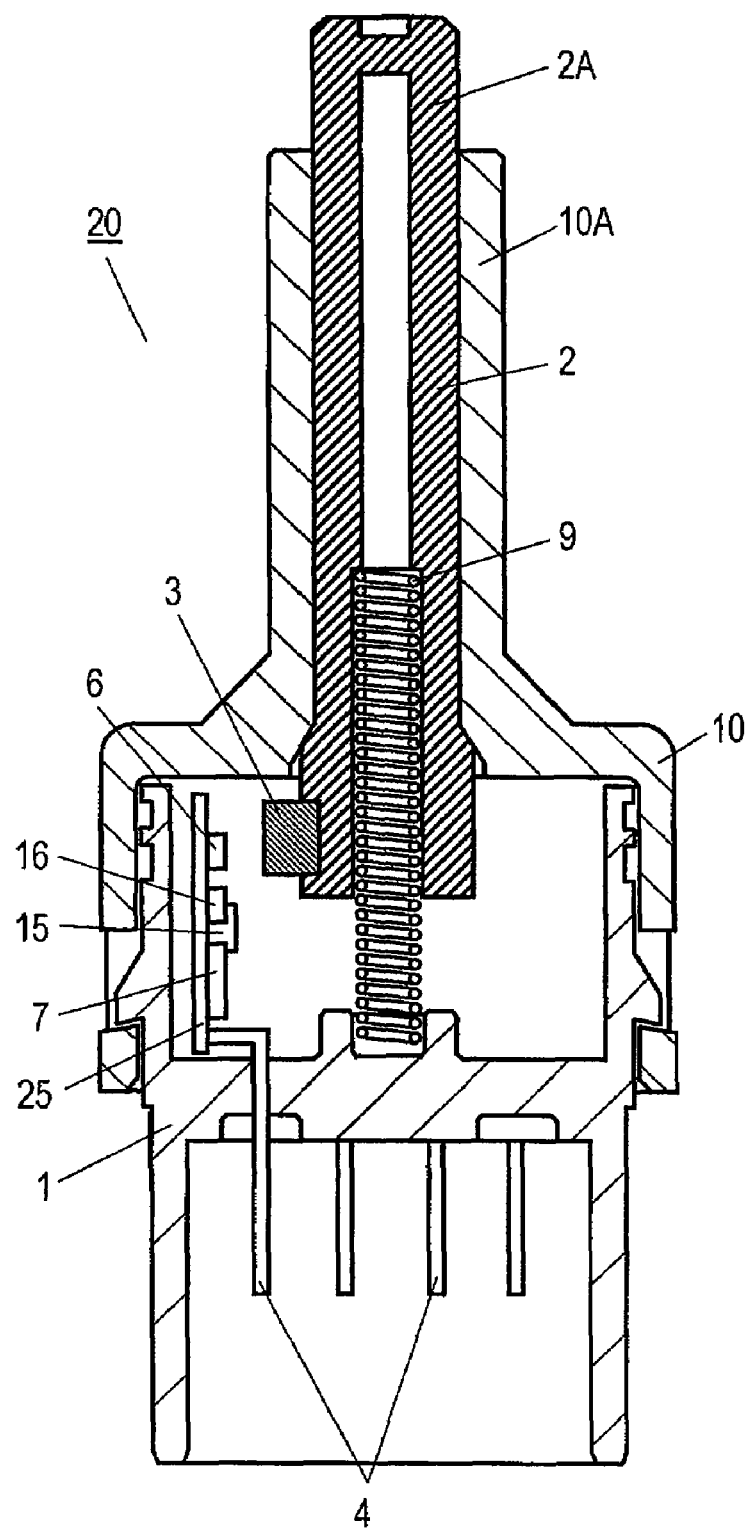
FIG. 1 is a cross-sectional view of a switch for vehicles according to a first embodiment of the invention.

Hereinafter, preferred embodiments of the present invention will be described.

In the following descriptions, like reference numerals will be attached to the same components as those described in the related art, and the detailed descriptions thereof will be omitted.

First Embodiment

Figure 2:
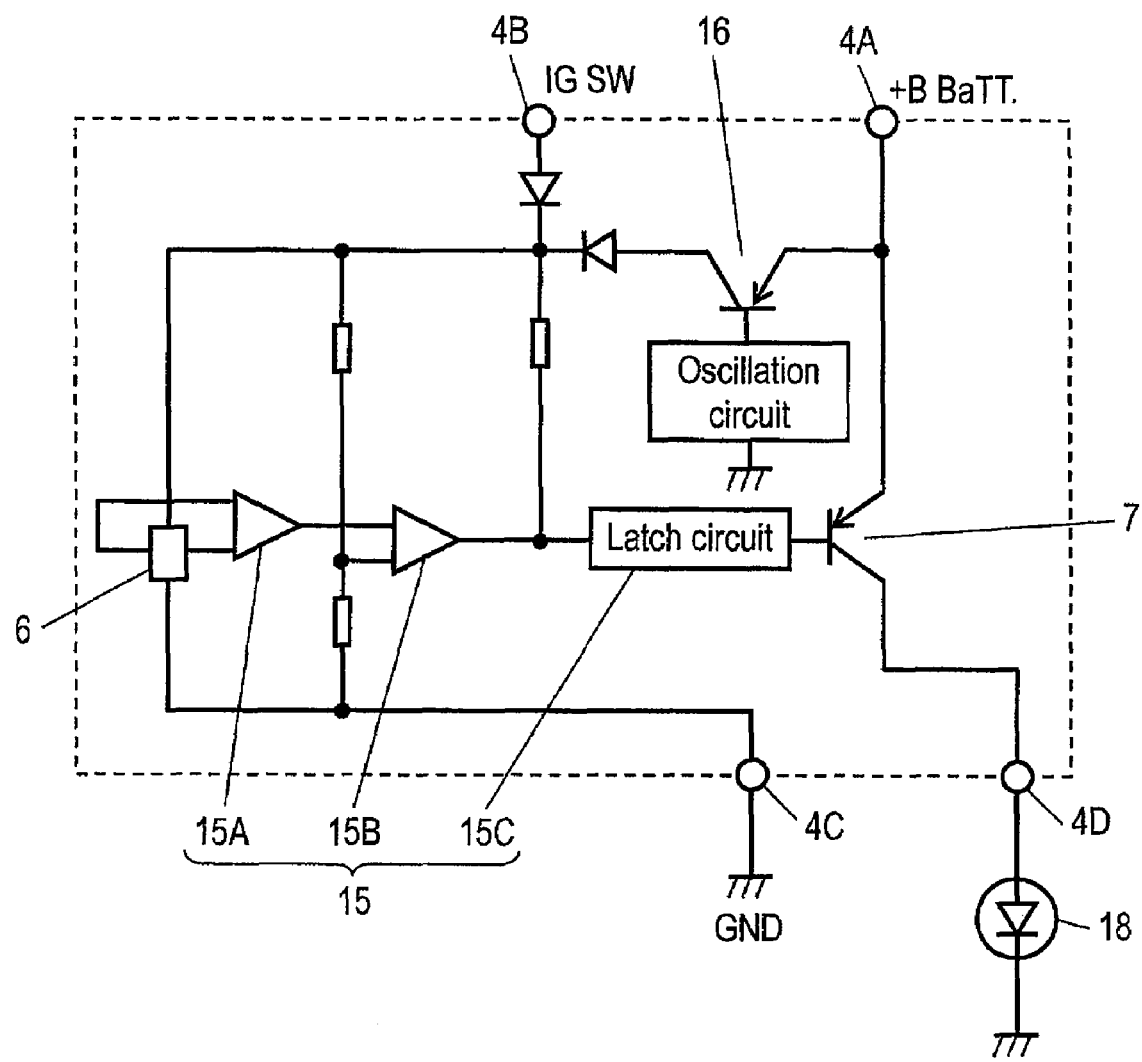
FIG. 2 is a circuit diagram of the switch for vehicles according to the first embodiment of the invention.

FIG. 1 is a cross-sectional view of a switch for vehicles according to a first embodiment of the invention. FIG. 2 is a circuit diagram of the switch for vehicles according to the first embodiment of the invention. In FIGS. 1 and 2, case 1 is formed in a box shape of which the top surface is opened, and is formed of insulating resin such as polybutylene terephthalate or ABS. Inside case 1, cylindrical operating body 2 which is formed of insulating resin is housed so as to vertically move. Further, operating body 2 has magnet 3 mounted on a lower left side surface thereof.

A plurality of terminals 4 are formed of conductive metal such as a copper alloy. Wiring substrate 25 has a plurality of wiring patterns (not shown) formed on the left and right surfaces thereof. Further, wiring substrate 25 is disposed at the left side wall of case 1, and the upper ends of terminals 4 are connected to the wiring patterns of wiring substrate 25 by soldering or the like. Further, the lower ends of terminals 4 project downward from the bottom surface of case 1.

Wiring substrate 25 has detection device 6 such as a hall element and switching device 7 such as a power transistor formed on one surface thereof facing magnet 3. Further, control device 15 is formed on the surface of wiring substrate 25, control device 15 including FET 15A for amplifying a voltage, FET 15B for comparing voltages, latch circuit 15C, and a plurality of fixed resistors. Detection device 6 and switching device 7 are connected to control device 15.

Intermittent driving device 16 is composed of an oscillation circuit and a transistor. One side of intermittent driving device 16 is connected to terminal 4A for battery connection, and the other side thereof is connected to terminal 4B for ignition-switch connection and control device 15. Further, detection device 6 and control device 15 are connected to terminal 4C for ground connection, and switching device 7 is connected to terminal 4D for connection of stop lamp 18.

Cover 10 formed of insulating resin covers the opening portion of the top surface of case 1. Further, coil-shaped return spring 9 is mounted in a state where it is bent between the lower surface of operating body 2 and the bottom surface of case 1. Return spring 9 biases operating body 2 upward, and the upper end of operating shaft 2A of operating body 2 projects upward from hollow cylindrical portion 10A formed in the center of the top surface of cover 10.

Figure 3:
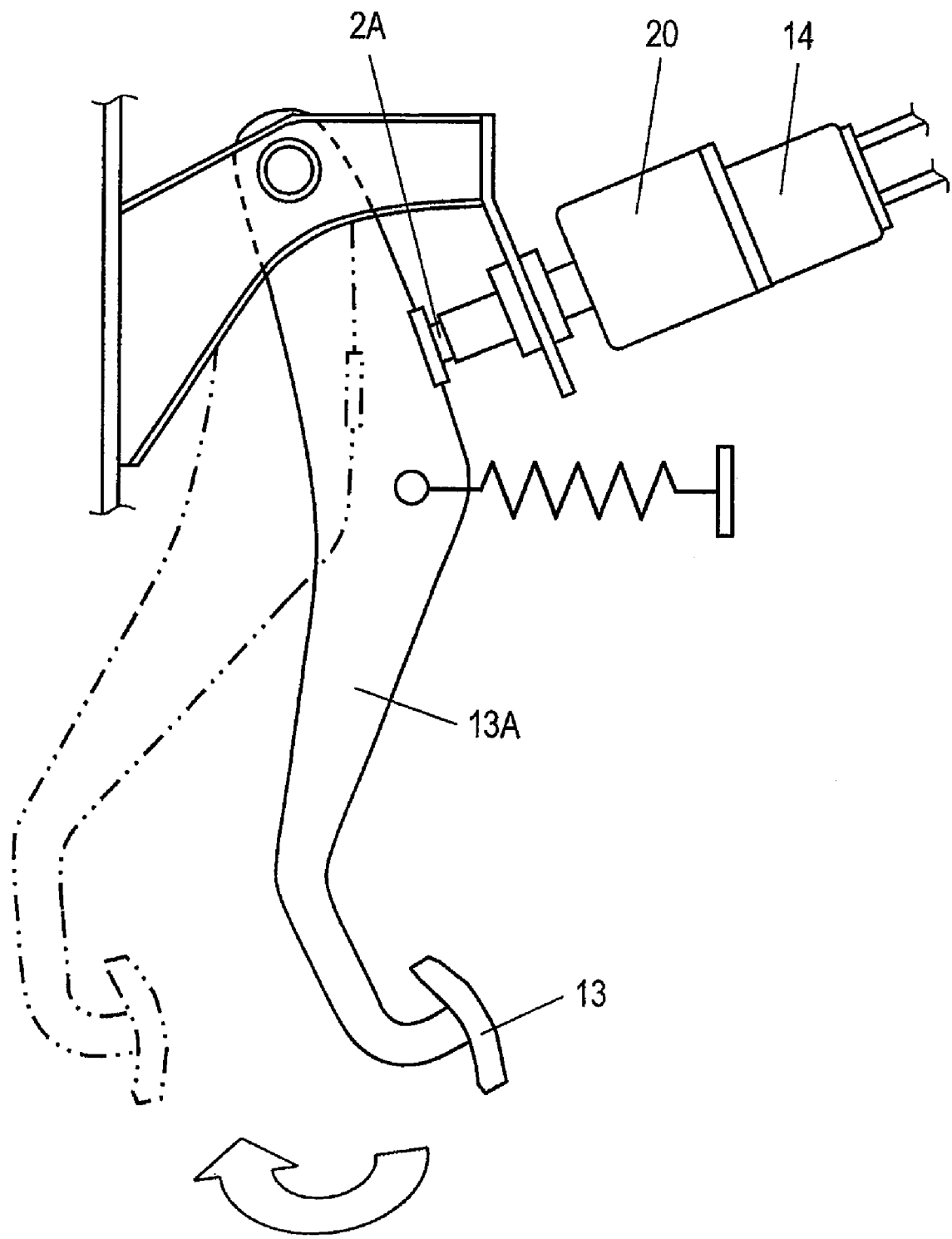
FIG. 3 is a side view of essential parts of a brake pedal using the switch for vehicles according to the invention.

FIG. 3 is a side view of essential parts of a brake pedal using the switch for vehicles according to the invention. In FIG. 3, switch 20 for vehicles according to the invention is mounted in front of brake pedal 13 of a vehicle in a state where operating shaft 2A of operating body 2 is pressed by arm 13A. Further, the plurality of terminals 4 projecting from the bottom surface of case 1 are connected to stop lamp 18 (refer to FIG. 2) composed of a plurality of light emitting diodes, an ignition switch, a battery and so on through connector 14 and lead wires.

As the ignition switch is turned on, an engine is activated, and power is supplied from terminal 4B (refer to FIG. 2). In this case, when brake pedal 13 is not stepped on, operating shaft 2A of operating body 2 is pressed downward while bending return spring 9, and magnet 3 mounted on the left side surface of operating body 2 is moved downward. Then, the center of detection device 6 disposed to face the center of magnet 3 is significantly separated from each other, and the magnetism of magnet 3 which is detected by detection device 6 decreases.

Control device 15 connected to detection device 6 controls switching device 7 based on the magnitude of the magnetism (magnetic flux density) detected by detection device 6. That is, when the magnetic flux density is equal to or more than a predetermined value, control device 15 switches switching device 7 into a close state. When the magnetic flux density is less than the predetermined value, control device 15 switches switching device 7 into an open state. Accordingly, in a state where operating body 2 is pressed, switching device 7 is set in the open state, and stop lamp 18 is turned off.

Next, when brake pedal 13 is stepped on, arm 13A is separated from operating shaft 2A such that the pressing force is canceled. Therefore, as shown in FIG. 1, operating body 2 is moved upward by the elastic restoring force of return spring 9. Then, magnet 3 mounted on the left side surface of operating body 2 is also moved upward in such a manner that magnet 3 and detection device 6 face each other. Accordingly, the magnetism of magnet 3 which is detected by detection device 6 increases. Then, control device 15 switches switching device 7 into the close state, and stop lamp 18 is turned on.

In the above-described operation of brake pedal 13, when the vehicle is stopped in a place where a following vehicle is present, and if brake pedal 13 is stepped on, stop lamp 18 (refer to FIG. 2) needs to be turned on, even in a state where the ignition switch is turned off so as to stop the engine.

Therefore, in the switch for vehicles according to the invention, even when the ignition switch is turned off to stop engine such that power is not supplied from terminal 4B, battery power is supplied to detection device 6 and control device 15 through intermittent driving device 16 from terminal 4A such that the supply of power is intermittently performed.

Figure 4A:
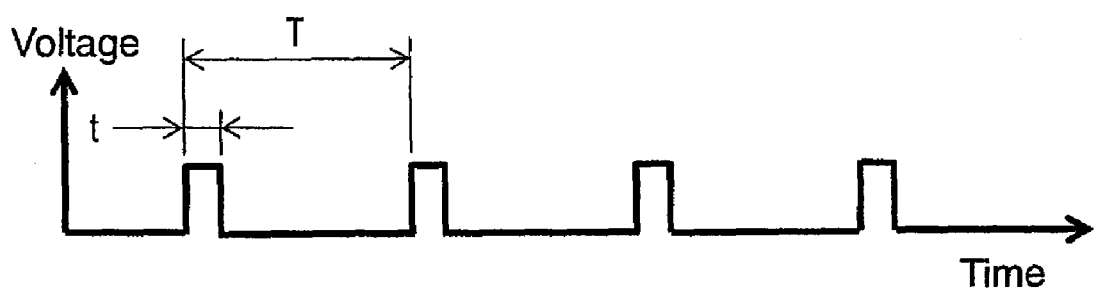
FIG. 4A is an output waveform diagram of an intermittent driving device of the switch for vehicles according to the first embodiment of the invention.

FIG. 4A is an output waveform diagram of the intermittent driving device of the switch for vehicles according to the first embodiment of the invention. In FIG. 4A, power is intermittently supplied from intermittent driving device 16 at a predetermined period. For example, an energizing time t is set to 0.1 msec, and period T is set to 1 msec.

Figure 4B:
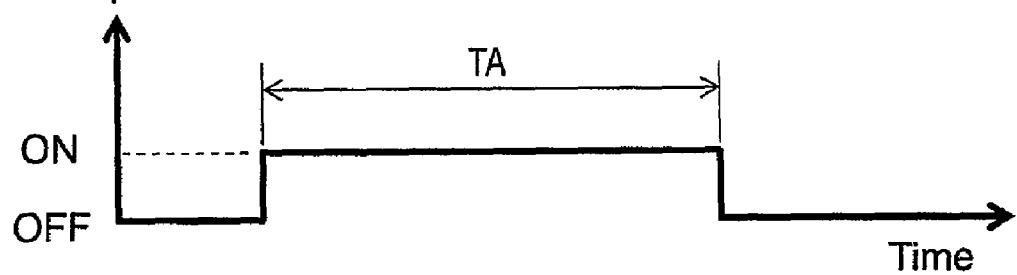

FIG. 4B is a diagram showing a term during which the brake pedal using the switch for vehicles according to the first embodiment of the invention is stepped on. In FIG. 4B, when brake pedal 13 is stepped on during a predetermined time TA, operating body 2 is moved upward in such a manner that magnet 3 and detection device 6 face each other, and the magnetic flux density of magnet 3 which is detected by detection device 6 increases. Then, the impedance of detection device 6 shown in FIG. 2 decreases, and a detection signal is output from control device 15 so as to be input to latch circuit 15C.

Figure 4C:
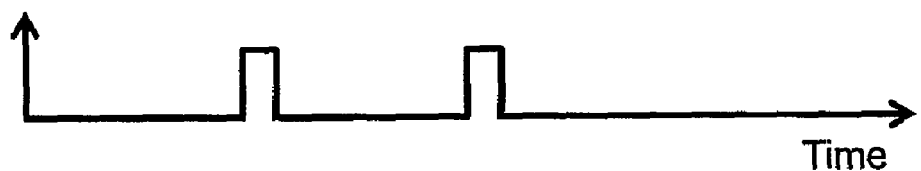
FIG. 4C is an input waveform diagram of a latch circuit of the switch for vehicles according to the first embodiment of the invention.

FIG. 4C is an input waveform diagram of the latch circuit of the switch for vehicles according to the first embodiment of the invention. In FIG. 4C, the input signal is a pulse signal which is output with a time width t at every period T. As a result, output signals are generated from latch circuit 15C for a predetermined term such that switching device 7 is set in the close state.

Figure 4D:
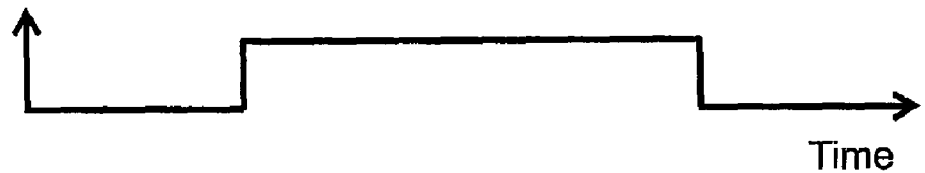
FIG. 4D is an output waveform diagram of the latch circuit of the switch for vehicles according to the first embodiment of the invention.
Figure 5:
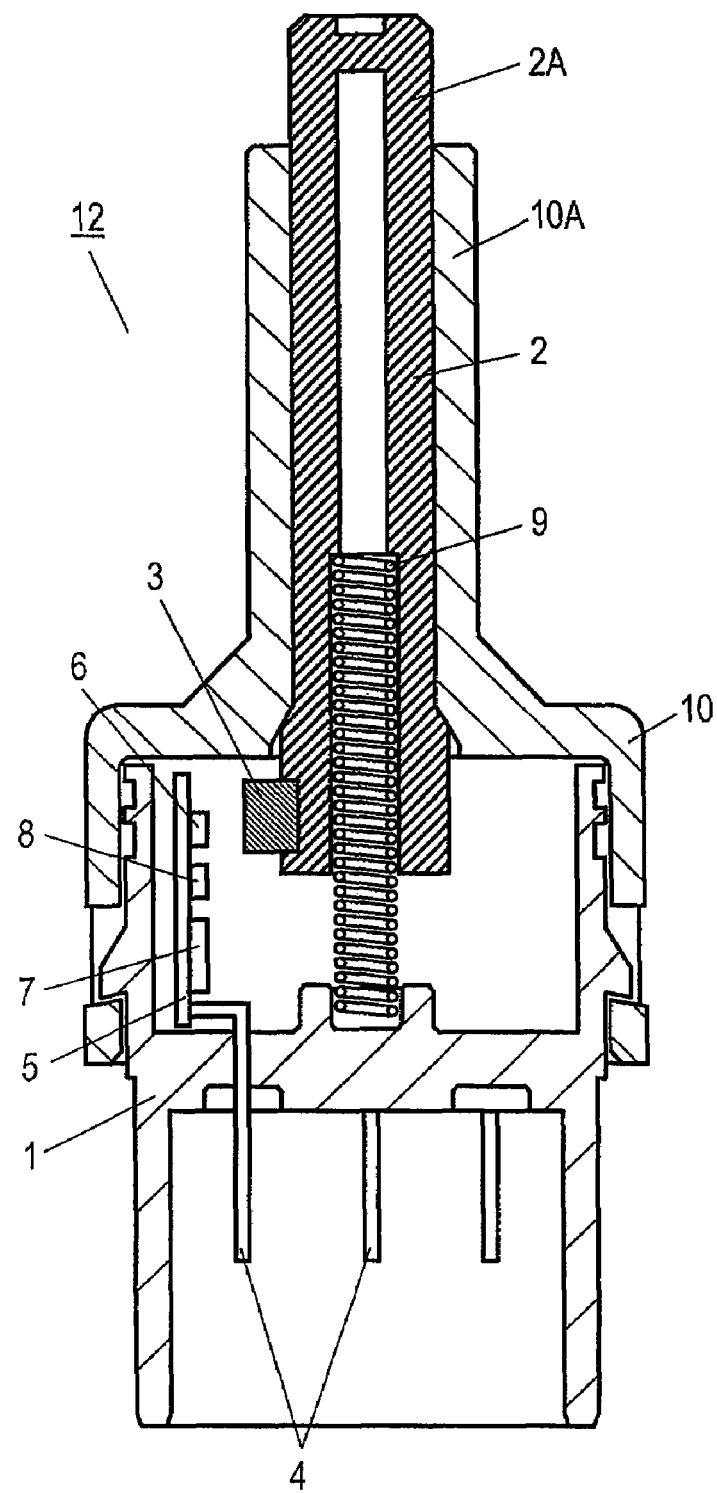
FIG. 5 is a cross-sectional view of a conventional switch for vehicles.
Figure 6:
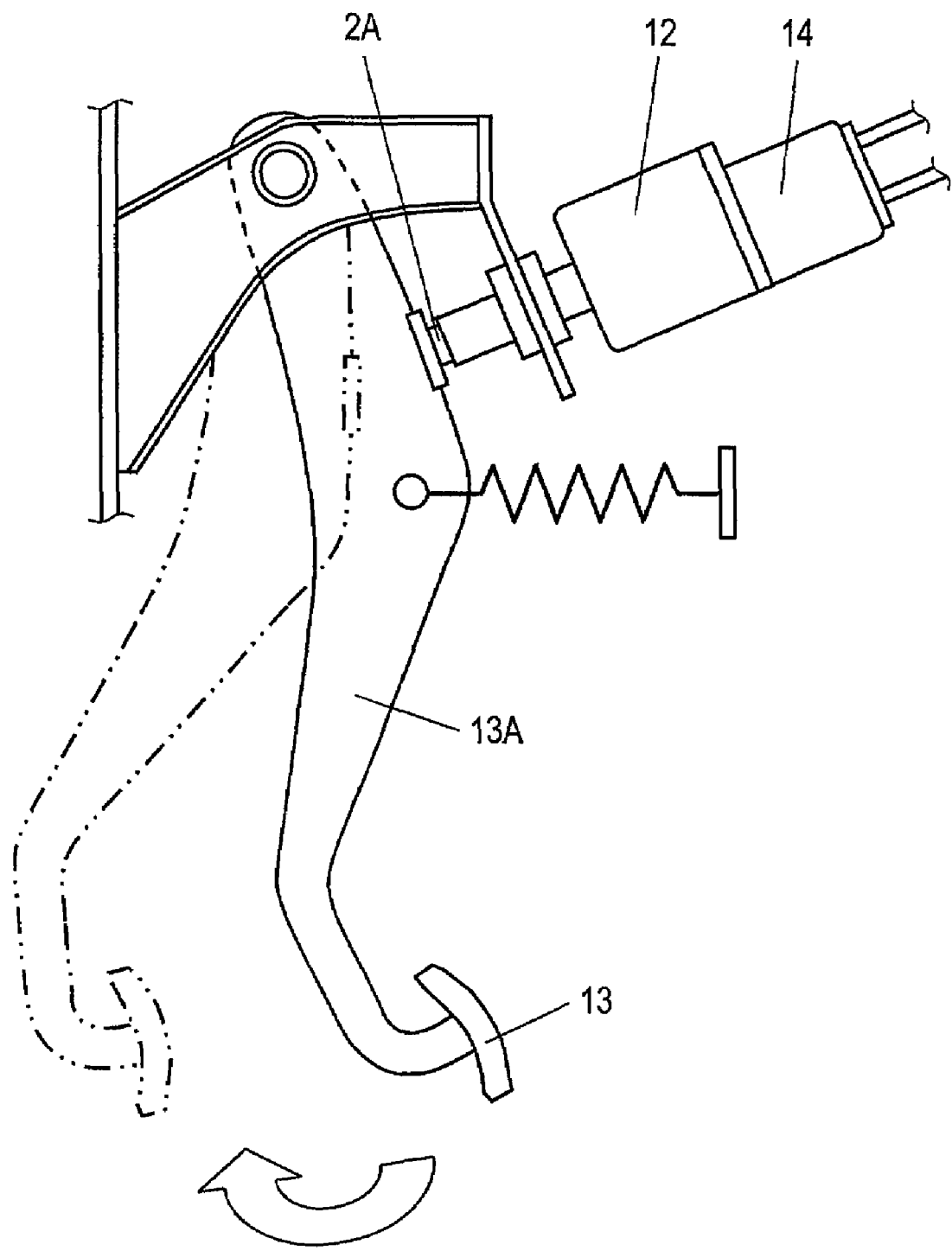
FIG. 6 is a side view of essential parts of a brake pedal using the conventional switch for vehicles.

FIG. 4D is an output waveform diagram of the latch circuit of the switch for vehicles according to the first embodiment of the invention. In FIG. 4D, the output signal is output at rising timing of the input signal of latch circuit 15C, and the output lasts by the time T. Accordingly, when a pulse signal is input to latch circuit 15C at period T, a continuous signal is output.

As such, control device 15 switches switching device 7 into the close state, and stop lamp 18 is turned on while at least brake pedal 13 is stepped on. Further, when brake pedal 13 is stepped on even in a state where the ignition switch is turned off so that power is not supplied from terminal 4B, stop lamp 18 is turned on. However, as power is intermittently supplied to detection device 6 and control device 15 from intermittent driving device 16 at a predetermined period, the consumption of the battery power is minimized. For example, when power is supplied in a state where the energizing time t is set to 0.1 msec and period T is set to 1 msec as described above, only about $\frac{1}{10}$ power is supplied, compared with when power is continuously supplied from the battery.

According to the first embodiment of the invention, as intermittent driving device 16 is connected to control device 15 which opens and closes switching device 7 depending on the magnitude of the magnetism of magnet 3 mounted on the operating body 2, the supply of power from the battery to detection device 6 and control device 15 is intermittently performed at a predetermined period by the intermittently driving device 16, which makes it possible to minimize the power consumption of the battery. Accordingly, it is possible to implement a switch for vehicles, which can achieve low power consumption and can reliably turn on and off the stop lamp.

In the above-described embodiment, the pressing-operation-type switch for vehicles has been exemplified which is mainly operated by the brake pedal. However, the invention can be also applied to switches having a different operation type from the pressing operation type, such as a switch for opening and closing a door and a switch for swing or horizontally sliding an operating body.

Further, it has been described that detection device 6, control device 15, and intermittent driving device 16 are formed as separate electronic parts. However, as those components are integrated so as to be formed as a one-chip part, the switch for vehicles can be simply constructed, which makes it possible to reduce a manufacturing cost.

The switch for vehicles according to the invention, which can achieve low power consumption and can reliably turn on and off the stop lamp, is effectively used for controlling the turn-on/off of a stop lamp of a vehicle.

What is claimed is:

1. A switch for vehicles that is usable with an operating body, said switch comprising:
    a detection device that detects movement of the operating body;
    a switching device that performs electrical connection/disconnection between a battery and a stop lamp;
    a control device that causes the switching device to open and close responsive to detected movement of the operating body by the detection device; and
    an intermittent driving device,
    wherein the intermittent driving device is connected to the control device such that supply of power from the battery to the detection device and the control device is intermittently performed at a predetermined period.

2. A switch according to claim 1, wherein a magnet is mounted on the operating body, the detection device detects magnetism of the magnet, and the control device opens and closes the switching device based on magnitude of the magnetism of the magnet.

* * * * *